United States Patent [19]

Carver et al.

[11] Patent Number: 4,808,946

[45] Date of Patent: Feb. 28, 1989

[54] LIGHTWEIGHT, HIGH POWER AUDIO AMPLIFIER AND POWER SUPPLY

[76] Inventors: Robert W. Carver, 330 Avenue "A", Snohomish, Wash. 98290; M. Robert McKinley, 17714 Palatine Ave. N., Seattle, Wash. 98133

[21] Appl. No.: 945,650

[22] Filed: Dec. 22, 1986

[51] Int. Cl.[4] .............................................. H03F 3/04
[52] U.S. Cl. ...................................... 330/297; 330/263
[58] Field of Search ............... 330/297, 265, 268, 273, 330/274, 296, 207 P

[56] References Cited

U.S. PATENT DOCUMENTS 4,218,660  8/1980  Carver .................................. 330/263
4,484,150 11/1984  Carver .................................. 330/265

Primary Examiner—Gene Wan
Attorney, Agent, or Firm—Hughes, Cassidy & Multer

[57] ABSTRACT

An audio amplifier and power supply having a power transformer with power supply and control means to provide pulses of electrical energy at a substantially constant supply voltage, with the duration of the pulses being dependent upon a value that is related to the demands of the amplifier. The transformer charges a power capacitor to a substantially constant voltage to supply power for the amplifier. The frequency range of the pulses is between about 400 to 2,000 cycles per second, with a frequency being at about 1,100 cycles per second in a preferred embodiment.

51 Claims, 6 Drawing Sheets

LIGHTWEIGHT, HIGH POWER AUDIO AMPLIFIER AND POWER SUPPLY

BACKGROUND OF THE INVENTION

1. Field of the Invention

The invention relates to an apparatus and method for audio signal amplification and for the supply of power incorporated therein.

2. Background Art

Solid state circuit components have brought significant reduction in the size, weight and cost of audio amplifier circuitry and have also achieved increased fidelity and sound reproduction as compared with vacuum tube technology of a prior generation. In an attempt to exploit to the limit the potential of solid state circuitry, audio engineers have striven to provide amplifiers with increased power ratings while achieving high quality sound reproduction. One of the results of this has been that many commercially available state of the art high-powered amplifiers (e.g. 400 watts or more) typically weigh anywhere from 16 kg to as high as 30-40 kg, depending upon the particular design and choice of materials. A significant portion of this weight is in the transformer and the associated heat sinks.

A significant advance in the design of audio amplifiers and their associated power supplies is described in U.S. Pat. No. 4,484,150, the inventor being Robert W. Carver, one of the co-inventors in the present application. In the apparatus described in that patent, there is a power supply which directs a conventional, commerically available sinusoidally varying supply voltage to the primary winding of a power transformer. The secondary winding of the power transformer charges capacitor to a desired operating level, wih these capacitors in turn supplying the power to the amplifying apparatus itself.

The sinusoidally varying power supply directed to the primary is regulated in a manner that during periods of low power requirements, a switching means is closed at a later time in the latter half of each half-cycle of the sinusoidally varying input voltage to provide a series of low power pulses. However, during periods of higher power requirements, the timing of the switching is changed so that the voltage is imposed on the primary winding at an earlier time in the latter portion of each half-cycle. Thus, the current pulses delivered during periods of peak power requirements are of substantially greater power than those produced during periods of low power requirements. It was found that the apparatus of U.S. Pat. No. 4,484,150 permits a dramatic decrease in the size (and hence in weight) of the power transformer.

A significant consideration relative to audio amplifiers is that the audio signal varies greatly in amplitude, having a series of "peaks" and "valleys", with the time periods of the valleys generally being substantially greater than the time periods of the peaks. For example, even what it is considered to be consistently loud music (i.e. "hard rock") has such peaks and valleys. It was found that the power supply described in U.S. Pat. No. 4,484,150, when incorporated in an audio amplifier with the greatly varying power requirements, could be designed to be quite small and yet operate quite effectively and efficiently in that particular environment.

It has long been known in the prior art that the size of a transformer depends upon various factors, one of these being the frequency at which the transformer operates. As the operating frequency increases, the number of turns in the coils can be reduced correspondingly for the same amount of power output, and this in turn means that the core size also decreases. Thus, the prior art teaches audio amplifiers with a vrey high frequency power supply (e.g. 20,000 Hz), so that a very small transformer can be used. However, while these do have certain advantages, and while for certain applications and design objectives these may be desirable, there are accompanying design problems which offset to some extent the advantages derived from the very high frequency power supply.

Another consideration in this circuitry for the regulation of the switching for the power supply of an audio amplifier. To optimize the design of the amplifier, it is necessary, as indicated above, that the power being supplied is properly related to the greatly varying power requirements of the amplfier. In addition, the circuitry must be designed in view of other factors, such as the possibility of variation in the voltage derived from the power line, and other possible variations resulting from the operation of the amplifier itself. For example, if the line voltage is at a low level, the circuitry should be arranged to react properly to this situation and not react so as to overburden the power supply at a voltage level that would not be obtainable during that period of low line voltage.

It is within the foregoing considerations in mind that the apparatus in the method of the present invention were developed, with a primary object of the present invention being to provide an audio amplifier and method where the size and weight of the transformer can be made relatively quite small, and yet give the amplifier a preferred balance of desired operating characteristics relative to the factors noted above.

SUMMARY OF THE INVENTION

The apparatus and method of the present invention are for amplifying an audio signal having an amplitude which varies at an audio frequency.

There is an audio amplifier means for amplifying a signal to produce an output corresponding to the audio signal. This amplifier means includes an audio signal receiving means for receiving the audio signal and a power receiving means for receiving electrical energy for producing the output. The amplifier means further comprises power capacitor means adapted to be charged to a substantially constant voltage level within a predetermined voltage range.

There is a power transformer having a primary winding and a secondary winding. The secondary winding is operatively connected to the power receiving means to charge the capacitor means to said substantially constant voltage level within said voltage range.

There is a power supply and control means adapted to be connected to a source of electrical power that provides power at a voltage source level within a predetermined voltage and range. This power supply and control means is further operatively connected to the primary winding to provide pulses of electrical energy of predetermined time periods of duration for the primary winding, with each pulse being of a substantially constant voltage level.

The power supply and control means further comprises a D.C. power supply to supply power at a substantially constant voltage. Further, there are switch means operatively connected between the D.C. power supply and the primary winding for operating in a conductive state to cause the pulses of electrical energy to be delivered to the primary winding. Further, this switch means has a non-conductive state.

There are sensing means responsive to magnitude of power demands of the amplifier means to provide a control value related to the magnitude of power demands of the amplifier means.

Further, there is provided control means responsive to the sensing means to cause the switch means to be conductive and non-conductive alternately to cause the pulses of electrical energy from the D.C power source to pass through the primary winding to energize the secondary winding. This is done in a manner that pulses of lesser duration are provided during periods of lower power requirements of the amplifier means, and pulses of greater duration are provided during periods of greater power demands of the amplifier means. This is done in a manner that under conditions where the voltage source level varies, the power supply and control means provides power pulses of adequate duration to supply the power demands of the amplifier means.

In the exemplary embodiment shown herein, the sensing means is responsive to magnitude of current passing through the transformer, and more specifically responsive to magnitude of current passing through the primary winding of the transformer. Further, the apparatus comprises a pulse generator and control means which generates control pulses for the switch means of predetermined pulse width. There is also pulse width reference adjustment means to provide an adjustment reference level input for controlling duration of the pulses.

More specifically, the pulse generator and control means produces periodic ramp voltage reference signals, each of which has an increase in voltage level during the period of that signal. This is comparator means to compare the ramp voltage reference signals with the control value of the sensing means to control pulse width of the control pulses.

Further, in the exemplary embodiment, there is a start up pulse width regulator means, and in the exemplary embodiment, this is responsive to the ramp voltage reference signals to cause the pulse generator and control means to initiate the control pulses. This start up pulse width regulator means is responsive to the sensing means to control duration of the signal pulses in response to current in the transformer rising above a predetermined level. Specifically, the pulse generator and control means has a disenable input adapted to receive a disenable signal to terminate production of the control pulses, and this is made responsive to the start up pulse width regulator means.

More specifically, there is a power input means to provide said D.C. power supply. This power input means comprises power input capacitor means adapted to be charged to at least a minimum operating level for operation of at least part of the apparatus. There is turn on and shut down means being responsive to the power input capacitor means to make the pulse generator and control means active and inactive in response to voltage on the power input capacitor means. Also, in the specific embodiment shown herein, the start up pulse width regulator means is made responsive to the turn on and shut down means to become operational.

The sensing means in this particular embodiment comprises impedance means connected in series with current passing through the transformer, and more specifically resistor means connected in series with the transformer.

In accordance with another aspect of the present invention, the control means is made responsive to a value which is equal to the line voltage times a constant, minus voltage on the capacitor means, where the constant is related to a turns ratio of the transformer means. This insures that regardless of variations in the voltage source level, pulses of adequate duration are provided to supply power demands of the amplifier means, while enabling power pulses of lesser duration to be delivered during periods of lower power requirements, regardless of such variations.

In accordance with yet another aspect of the present invention, it has been found that a very desirable balance of operating characteristics can achieved by operating the control means so that the switch means is turned on and off to cause the power pulses to be provided for the transformer at a frequence between 400 to 2,000 cycles per second. More desirably, this range is between 800 to 1,500 cycles per second. In the present embodiment, this frequency is at about 1,100 cycles per second. One cycle comprises a pair of pulses provided for the transformer, and in the present embodiment, this pair of pulses is provided alternately between two sections of the transformer.

Other features of the present invention will become apparent from the following detailed description.

DESCRIPTION OF THE PREFERRED EMBODIMENT

(a) Introduction

In general, the apparatus of the present invention has a power supply which delivers a series of square wave pulses to the primary winding of the transformer, with the width of these pulses being varied in accordance with the power requirements of the amplifier. It has been found that if the frequency of these pulses is within a predetermined frequency range, it is possible to design and operate a power transformer quite advantageously. More specifically, the broad frequency range would be between about 400 to 2000 Hz, with the preferred range being between 800 to 1500 Hz. In the preferred embodiment described herein, the frequency is at 1100 Hz. In the latter part of this description, there will be further discussion as to the advantages this provides in the design and operating characteristics of the transformer. However, this will be preceded by a general discussion of the overall operation of the amplifier, with reference to FIG. 1, and also a more detailed description of the control circuitry. A further significant feature of the present invention is the control circuitry which is so arranged that it can properly and reliably control the pulses supplied to the primary winding of the transformer. This will be described more fully herein.

(b) General Description

Figure 1:
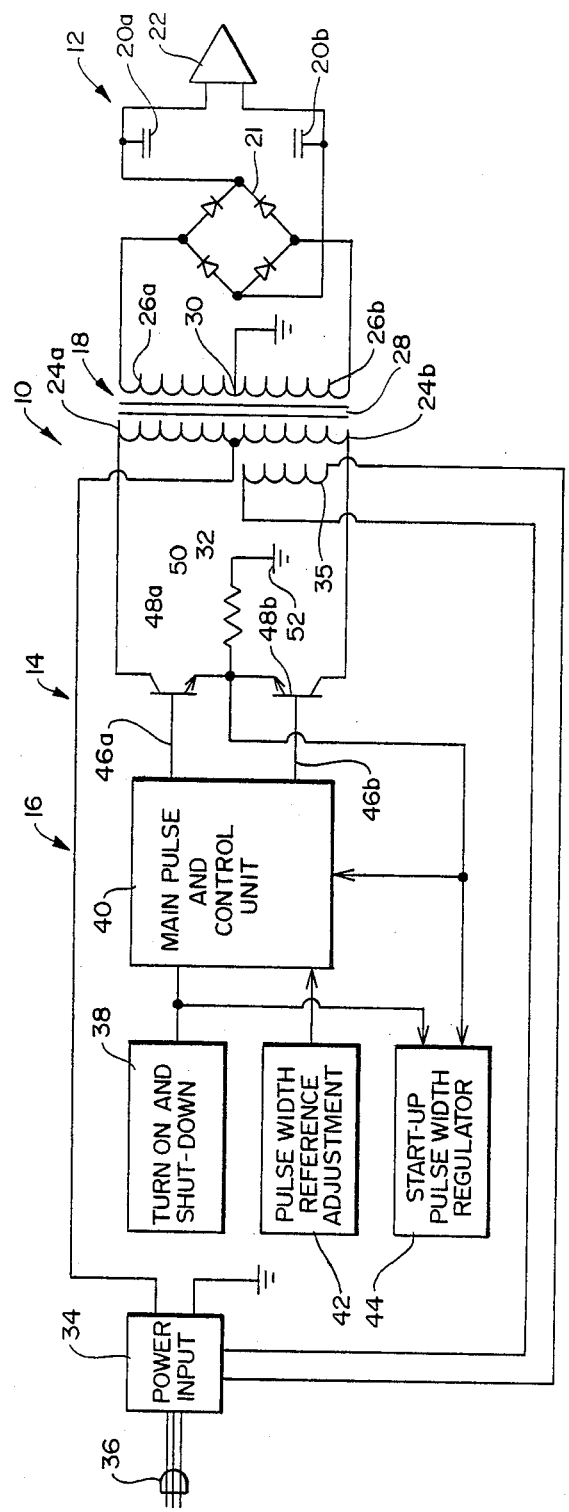
FIG. 1 is a block diagram of the main components of the amplifier of the present invention.

With reference to FIG. 1, the apparatus 10 can be considered as comprising an amplifier section, generally designated 12, and a power supply section, generally designated 14, with the power supply 14 in turn being subdivided into a control circuitry 16 and a power transformer 18. The amplifier section 12 can be, in and of itself, of conventional design, and if desired, the amplifier section described in U.S. Pat. No. 4,484,150 can be used. Such an amplifier is characterized in that it has a pair of power capacitors 20a and 20b (or several pairs of capacitors with stepped voltages) which are charged up to suitable operating voltage levels from the transformer 18 and through the rectifying bridge 21 to operate the amplifier circuitry itself, generally designated 22.

The power transformer 18 comprises a primary winding 24, a secondary winding 26, and a core 28. The secondary winding 26 is tapped at a center location 30 to ground, while the primary winding 24 is center tapped at 32 to a substantially constant D.C. voltage source provided from the power input component 34 of the control circuitry 16. A third winding 35 is energized by the primary winding to provide power at a lower voltage to the power input component 34.

To describe generally the control circuitry 16, there is the aforementioned power input component 34. This functions to receive power from a line voltage source 36, rectify the current, and to supply a substantially constant D.C. voltage to the center tap location 32 of the primary winding 24. In addition, the power input 34 provides a secondary lower voltage D.C. power source to operate the other components of the control circuitry 16.

There is a turn-on and shut-down component 38 which responds to the power input 34 to determine when the secondary power source is at a sufficiently high voltage level (e.g. at about 24 volts) to begin operation of the other components of the control circuitry 16. In addition, this turn-on and shut-down component 38 causes the apparatus to shut down when the voltage on the secondary supply of the power input 34 drops below a minimum level (i.e. 8 volts). Further, this component 38 responds to various undesired (or fault) conditions (e.g. overheating, excessive high frequency conditions, etc.) to cause the apparatus to shut down.

There is a main pulse generator and control unit 40, and this serves several functions. Its main function is to provide regularly timed pulses to alternately deliver power to the two halves of the primary winding 24, and to regulate the width of these pulses properly in accordance with the power delivered to the amplifier portion 12. In addition, this component 40 provides a suitable reference voltage (i.e. 5 volts) to operate other components in the control circuitry 16, and regular clocking wave forms are provided for functions to be described hereinafter.

There is a pulse width reference adjustment component 42, and as its name implies, this provides a reference voltage for the main pulse generator and control unit 40 to permit this component 40 to more accurately control the width of the output pulses generated.

There is also provided a start up pulse width regulator 44 which serves a special function during the first several seconds of operation where the apparatus is charging up the main power capacitors 20a and 20b of the amplifier section 12. (This function will be described in more detail later herein.)

The pulses from the main pulse generator and control unit 40 are directed alternately through the two lines 46a and 46b to the base of one switching power transistor 48a, and then to the base of the second switching power transistor 48b. When the upper transistor 48a is turned on, current is directed from the mid-point 32 of the primary winding 24 through the upper half 24a of that winding through the transistor 48a, and thence through a regulating resistor 50 to ground at 52. In like manner, when the transistor 48b is conducting, current flows from the mid-point 24 through the lower half 24b of the primary winding 24, and then back through the transistor 48b, through the resistor 50 to ground at 52. The resistor 50 has a very low resistance (in the preferred embodiment 0.008 ohms) and provides an important regulating function which will be described later herein.

As current is directed alternately between the two primary winding sections 24a and 24b, the secondary winding 26 is energized to direct current through the rectifying bridge 21 to the capacitors 20a and 20b and charge these to a suitable operating level (e.g. 20a to +75 volts, and 20b to −75 volts). (Also, if desired, a plurality of stepped capacitors, such as those shown at 20a and 20b, could be employed to provide stepped voltage power sources in accordance with the power requirements of the amplifier section 22, as disclosed in U.S. Pat. No. 4,484,150.

With regard to the regulating function provided by the resistor 50, this will be discussed more fully later herein, but it is believed a brief explanation of the same would be appropriate at this time. It can be recognized that as the current flowing through each of the transistors 48a or 48b increases, the voltage drop across the resistor 50 increases. The control voltage from the resistor 50 is utilized by the main pulse generator and control unit 40 to determine the pulse width. Also, during the start-up phase, this voltage across the resistor 50 is used as a control voltage by the start-up pulse regulator 44 to limit the pulse width to an appropriate value. After the start-up phase (i.e. when the power capacitors 20 are charged up to an adequate operating level), then the start-up pulse width regulator 44 has no further effect on the pulse width. As stated above, the particular advantages of this type of regulating mode will be discussed more fully later in this description.

There will now follow a more detailed description of the control circuitry, after which, there will be a more general discussion of the significant operating features and advantages of the present invention.

(c) The Power Input 34

Figure 2:
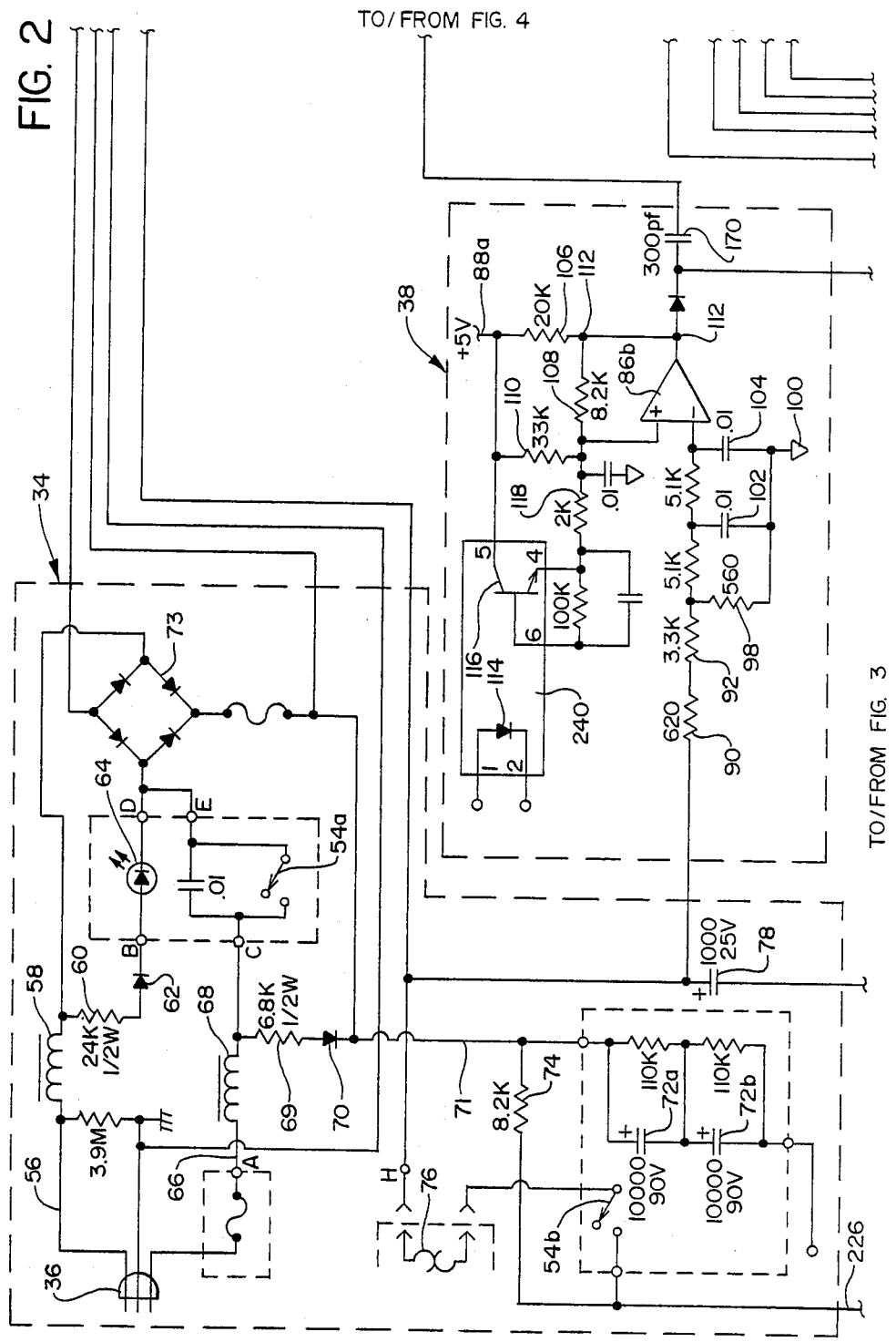
FIGS. 2 through 5 constitute a single circuit diagram of the power supply and control circuitry of the present invention.

With reference to FIG. 2, which shows the power input 34 and the turn-on and shut-down control 38, when the power switch 54a is closed, power flows from the plug 36 through the line 56 to pass through the inductance coil 58, the resistor 60 and the diode 62 to pass through the pilot light 64 to indicate an on condition, and thence back through the switch 54a and through the line 66 back to the plug 36. Current also flows through the rectifying bridge 73 to charge the capacitors 72a and 72b. However, after the plug 36 is inserted into the socket of power source, but before the switch 54a is closed, there is a trickle of current through the coil 68, resistor 69, and diode 70 to charge the two main power supply capacitors 72a and 72b to a certain intermediate level. The reason for this is that when the switch 54a is closed, the surge of current that passes to the capacitors 72a and 72b will be somewhat less so as to protect the switch 54a from an overcurrent.

At the same time that the switch 54a is closed, the switch 54b is also closed. This provides a current path from the line 71, through the resistor 74, through the switch 54b, through a thermal switch 76 to charge a capacitor 78. This capacitor 78 charges up to as high as 24 to 26 volts, and this is the secondary power supply to operate certain components of the control circuitry 16, and also to supply power to the transistors that in turn operate the main switching power transistors 48a and 48b. Also, as mentioned previously herein, to maintain the charge on the capacitor 78 and supply this secondary power, current is derived from the third winding 35 at the transformer 18.

Figure 3:
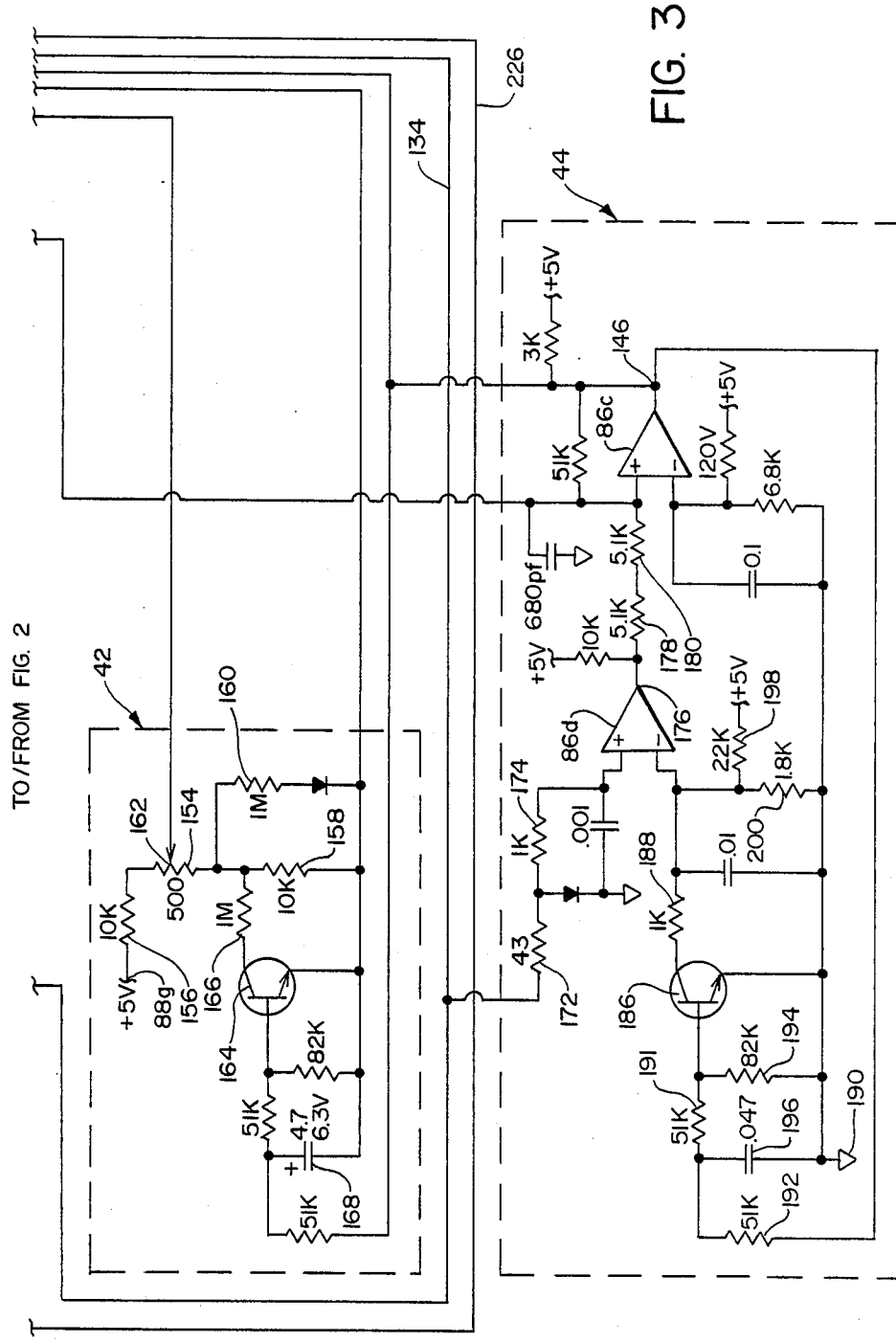

Specifically, the capacitor 78 supplies current at an input pin 80 of an integrated circuit component 82 (see FIG. 4) which is a main part of the main pulse generator and control unit 40. In addition, the capacitor 78 supplies current to an input pin 84 of a second integrated circuit 86, which appears at four different locations in the drawings. For convenience of illustration, these four parts of the second integrated circuit 86 are shown at separate locations and are designated 86a (FIG. 4), 86b (FIG. 2), 86c, and 86d (FIG. 3).

Also, it should be mentioned at this time that the integrated circuit 82 provides a five volt reference voltage, and these are shown at eight locations in the drawings, designated 88a through 88i.

(d) The Turn On and Shut Down Control 38

With further reference to FIG. 2, this component 38 comprises a comparator 86b which, as indicated before, is part of a second integrated circuit 86. The minus input of this comparator 86b is connected to the capacitor 78 through a series of resistors 90, 92, 94 and 96, with the connection between resistors 92 and 94 leading through resistor 98 to ground at 100. Also, two capacitors 102 and 104 connect on opposite sides of the resistor 96 to the ground 100.

The +5 volt reference source 88a connects to a plus terminal of the comparator 86b through the resistors 106 and 108, connected in series, and also through the resistor 110 which is in parallel with resistors 106 and 108. The intermediate connection point between the resistors 106 and 108 is connected to the output 112 of the comparator 86b.

The operation of the comparator 86b is such that when the output 112 of the comparator 86b is high, this acts on the comparator 86c (see FIG. 3) of the start up pulse width regulator 44 to cause the comparator 86c also to go high. (As will be described later herein, when the comparator 86c goes high, this sends a "disenable signal" to the integrated circuit 82.) However, when the output at 112 from the comparator 86b goes low, this does not cause the comparator 86c to go low, the reason for this being that the comparator 86c is provided with an hysteresis characteristic.

This turn-off and shut-down control unit 38 is also provided with a shut-down mechanism which is or may be conventional, this shut-down mechanism responding to such conditions as an excess of high-frequency energy in the amplifier, overheating, a short circuit, etc. There is a light emitting diode 114 which, when activated, causes the transistor 116 to become conductive to provide a current path through the resistor 118 to the plus terminal of the comparator 86b. This tends to cause the positive terminal of the comparator 86b to be more positive which in turn causes the output at 112 to go high, this causing the comparator 86c to go high, which in turn sends a disabling signal to the integrated circuit 82 so as to stop the current pulses which alternately turn on the main switching power transistors 48a and 48b.

Also, when the charge on the capacitor 78 drops to a predetermined low level, below which the apparatus 10 is not able to operate properly (in the present embodiment, below 8 volts), this causes a voltage drop at the minus terminal of the comparator 86b to cause the output at 112 to go high. This also causes the transmission of the disabling signal through the comparator 86c which in turn causes the integrated circuit 82 to become non-operative.

(e) The Main Pulse Generator and Control Unit 40

Figure 4:
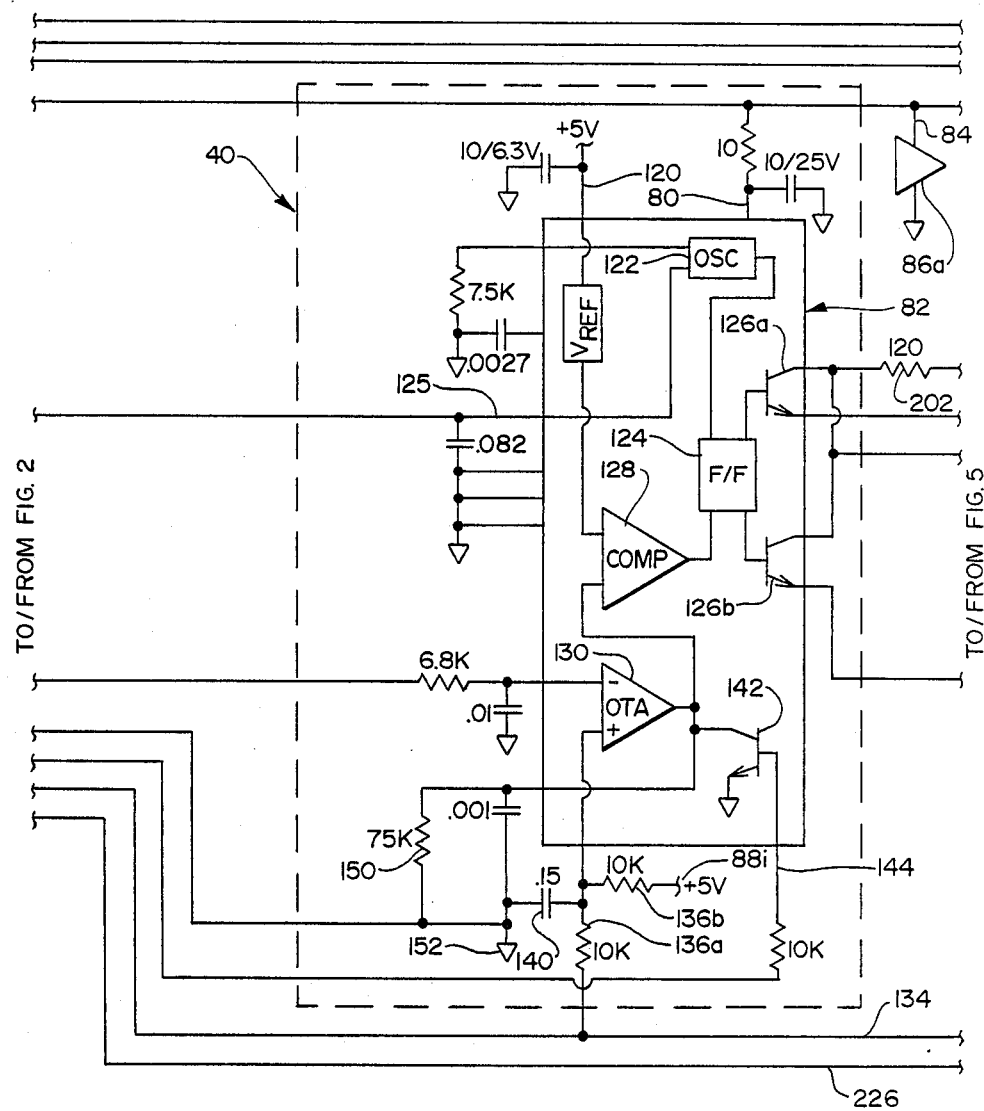

With reference to FIG. 4, as discussed previously, this component 40 comprises the main integrated circuit chip 82 having a power input terminal at 80. Also, as indicated previously, the integrated circuit 82 provides a reference voltage of +5 volts at various locations, this being accomplished through the output pin 120.

This integrated circuit 82 is a standard chip, specifically chip number 3524, which is described in a book entitled, "RCA Solid State - Linear Integrated Circuits and MOS/FET's, Catalog Book Number SSD-240B", bearing a copyright notice of 1982. In this particular circuit diagram, this chip 82 is shown schematically, in that certain functional components are shown somewhat schematically to facilitate the description of the functions of this chip 82 is the present invention. This integrated circuit or chip 82 has an oscillator 122 which provides clocking signals that are transmitted to a logic circuit 124, and also provides a clocking wave form as a ramp voltage output through a pin at 125. This ramp voltage output is such that it climbs upwardly to a predetermined voltage level, and then it drops abruptly down to a zero level, after which it again begins to climb to a predetermined peak voltage level.

As indicated previously, the main function of the integrated circuit 82 is to supply the two control signals to cause the two switching power transistors 48a and 48b to turn on alternately for a predetermined pulse width period. To accomplish this, the integrated circuit 82 (hereinafter IC 82) has two transistors 126a and 126b which are turned on alternately by the logic circuit 124. To determine the width or time period of the two pulses, the logic circuit 124 receives an input from a comparator 128. The comparator 128 in turn receives its two inputs, one being the ramp voltage signal from the oscillator 122, and the other being an input from the operational transconductance amplifier 130.

The amplifier 130 receives an input at its minus terminal from the aforementioned pulse width reference adjustment control 42. (This will be described more fully later herein in the detailed description of component 42.) The plus terminal of the amplifier 130 receives its input from the aforementioned control resistor 50, with the voltage at a point 132 to the left of the resistor 50 (see FIG. 5) being directed through line 134 through two voltage dividing resistors 136a and 136b to the voltage reference source 88i. The juncture point 138 between the two resistors 136a and 136b is in turn connected to the capacitor 140 which serves to integrate the voltage spikes from the resistor 50.

There is also provided in the IC 82 a shut-down transistor 142, the base of which is connected to a shut-down pin 144 that receives an input from the output terminal 146 (see FIG. 3) of the comparator 86c. When the output at 146 is high, this provides a voltage at the base of the transistor 142 to cause it to be conductive, and thus essentially short the output from the amplifier 130 to ground. This acts through the comparator 128 so as to stop the logic circuit 124 from activating either of the control signal switching transistors 126a and 126b.

The resistor 150 that connects the output of the amplifier 130 to ground at 152 sets the gain of this amplifier 130.

(f) The Pulse Width Reference Adjustment Control 42

With reference to FIG. 3, the precise setting of the reference voltage for the amplifier 130 of the main pulse generator and control unit 40 is provided by the resistor 154 which functions as a rheostat. This resistor 154 is connected through a resistor 156 to a reference voltage 88g. The opposite end of resistor 154 is connected to two other resistors 158 and 160, connected in parallel to the ground location 152 (FIG. 4). It is evident that by adjusting a connecting point 162 relative to resistor 154 that the reference voltage provided at the minus terminal of the amplifier 130 in the IC 82 can be controlled.

During the start-up phase, for reasons which we will describe hereinafter, it is desired to make some adjustment in the reference voltage to the amplifier 130. For this reason, there is provided a transistor 164, the collector of which is connected through a resistor 166 to a point between the resistors 154 and 158. The emitter of the transistor 164 is connected to ground at 152 (FIG. 4). The base of the transistor 164 is connected to the output 146 of the comparator 86c, and during periods when this output 146 is high, this causes a positive charge to be imposed upon the capacitor 168. In this condition, the transistor 164 becomes conductive so as to slightly lower the reference voltage at the location 162.

(g) The Start-Up Pulse Width Regulator 44

With reference to FIG. 3, attention is first directed to the comparator 86c. As indicated previously with reference to the comparator 86b of the turn-on and shut-down control 38, when the output 112 of the comparator 86b is high, this causes the output 146 of the comparator 86c to be high. However, when the output 112 of this comparator 86b goes low, because of the hysteresis of the comparator 86c, this does not cause the output 146 of the comparator 86c to go low. Also, as indicated previously, a low output at 146 is an enabling signal which permits the integrated circuit 82 to begin emitting its control pulses from the two transistors 126a and 126b.

When the switches 54a and 54b are initially closed, as described previously, a charge begins to build up on the auxiliary power source capacitor 78, until this charge is sufficiently high (i.e. 24 volts) so that it acts on the minus terminal of the comparator 86b to cause the output 112 to go low. Prior to this occurrence, it would not be possible for the comparator 86c to have a low output, since the high output at 112 of the comparator 86b would maintain the comparator 86c at a high output stage. With the output at 112 low, the output at 146 of the comparator 86c is brought to a low condition in the following manner.

The output at the pin 125 of IC 82 is, as described previously, a ramp voltage output where the voltage level rises linearly to a predetermined level, after which the voltage abruptly drops. At the instant when this abrupt voltage drop occurs, there is a strong negative pulse which is caused to travel from the capacitor 170 (FIG. 2) down to the plus terminal of the comparator 86c. This causes the output 146 of the comparator 86c to go low, which in turn acts through the pin 144 (i.e. the shut-down pin) in a manner to turn off the transistor 142. (See FIG. 4) This enables the amplifier 130 to operate through the comparator 128 which in turn operates through the logic circuit 124 to cause one or the other of the transistors 126a or 126b to be conductive. (This will depend upon which of these transistors 126a and 126b is enabled by the action of the oscillator 122.)

Let it be assumed for the moment that the transistor 126a is turned on. Through the switching circuitry which leads up to the transistor 48a, this transistor 48a is caused to be conductive, which in turn causes current to flow from the primary winding mid location 32, through the upper primary winding portion 24a, through the transistor 48a, through the control resistor 50, back to ground at 52. When the apparatus is initially turned on, as mentioned previously, the two main power capacitors 20 have little or no charge. Thus, the current passing through the primary winding 24a and through the transistor 48a and the resistor 40a sees, in effect, a short circuit. The current will begin to rise very rapidly, and thus the voltage drop across the resistor 50 will experience a rapid rise. This voltage at point 132 (FIG. 5) is transmitted back through the line 134 and through two resistors 172 and 174 to the plus terminal of the comparator 86d. This causes the output 176 of the comparator 86d to in turn go high, and this high signal is transmitted through resistors 178 and 180 to act at the positive terminal of the comparator 86c to cause its output at 146 to go high. As described previously, a high output at 146 is a disenabling signal for the integrated circuit 82. More specifically, the high at 146 causes the transistor 142 in the IC 82 to become conductive and essentially short out the output from the amplifier 130. This in turn shuts off the signal from the then conducting transistor 126a and shuts off the current through the transistor 48a.

On the next clocking pulse from the output pin 125, the output 146 of the comparator 86c is again caused to go low, which is the enabling signal for the IC 82. In the meantime, the oscillator 122 has operated through the logic circuit 124 to cause the other transistor 126b to be functional. The output signal from the emitter 126b acts through the switching circuitry to turn on the transistor 48b, and the same cycle repeats itself again, with current flowing through the other primary winding portion 24b.

As this sequence keeps repeating itself for a period of several seconds, the charge on the two main power capacitors 20 keeps building up, and the current rise through each of the main power transistors 48a and 48b becomes less abrupt. At a certain point in time, the voltages on the capacitors 20 are at a sufficiently high level so that the voltage rise across the resistor 50 simply does not reach the cut-off level (i.e. does not reach a sufficiently high level where it causes the comparators 86d and 86c to go high), and at this point, the output at 146 simply remains low from that time on, until some other even would cause it to turn high again. (This would occur during shutdown when the charge on the capacitor 78 drops to below 8 volts, thus causing the comparator 86b to go high, which in turn would cause the output 146 of the comparator 86c to go high.)

Thus, as described immediately above, after the start-up phase, the start-up pulse width regulator 44 essentially becomes inoperative, and the IC 82 becomes fully responsible for the operation of the transistors 126a and 126b. As indicated previously, the timing of the pulses is determined by the oscillator 122, and the switching from one transistor 126a to the other transistor 126b is controlled by the logic circuitry 124. The duration of the pulses is determined from the comparator 128 which receives its input from the ramp voltage output that goes to the pin 125, and also from the output of the amplifier 130.

As a refinement to the start-up pulse width regulator 44, there is provided a transistor 186, the collector of which is connected through a resistor 188 to the minus terminal of the comparator 86d. The emitter of the transistor 186 is connected to ground at 190. The base of the transistor 186 is connected through two resistors 191 and 192 in series to the output 146 of the comparator 86c. The base of the transistor 186 also has a connection through resistor 194 to ground 190.

When the output at 146 is high, this sends positive current through the resistors 191 and 192 to the base of the transistor 186. The capacitor 196 has an integrating function so that when the duration of the "high" periods of the output 146 are sufficiently great, the transistor 186 remains conductive. This provides an additional conductive path from the location between the two voltage dividing resistors 198 and 200 which provide the reference voltage at the minus terminal of the comparator 86d. This in effect lowers the reference voltage at the minus terminal of comparator 86b during the start-up phase to reduce the over-current trip point.

(h) Other Features Of The Control Circuitry

The emitters of the transistors 126a and 126b are connected to the base electrodes of driver transistors 200a and 200b, respectively, the emitters of which are in turn connected to the base electrodes of the switching power transistors 48a and 48b. Thus, when the transistor 126a becomes conductive, it in turn acts through its related transistor 200a to make the transistor 48a conductive. The transistor 126b acts in the same manner through the transistor 200b to turn on the transistor 48b.

As a refinement to this particular switching circuitry, a resistor 202 (FIG. 4) is placed in series between the secondary voltage source (i.e. the capacitor 78) and the collectors of the transistors 126a and 126b. When either of these transistors 126a and 126b is conducting, there is of course a voltage drop across resistor 202. As soon as the transistor 126a or 126b that is conducting turns off, then the left side of the resistor 202 experiences an abrupt voltage rise, which in turn acts through the capacitor 204 (FIG. 5) to cause a positive pulse to be transmitted to the base of a transistor 206. This makes the transistor 206 conductive so that it immediately draws off the base current from the transistor 200a or 200b (depending upon which one is conductive at that time). This fast discharge path causes the transistors 200a and 200b to shut off quite rapidly. This avoids a possible situation where the transistors 200a and 200b may react more slowly, with the possible result being a short overlapping period of time where the two transistors 48a and 48b would be on simultaneously.

As a further refinement, to limit the drive current and dissipation of the transistors 200a and 200b under light loads, the base of the transistor 200a is connected through diodes 208 and 210, and also resistor 212 to the collector terminal of the transistor 48a. In like manner, the base of the transistor 200b is connected through diodes 214 and 216, and also through resistor 218 to the collector of the transistor 48b. The effect of this is to cause less current to flow across the transistors 200a and 200b during light load conditions, and thus prevent possible overheating of the transistors 48a and 48b.

To provide a continuing supply of secondary power in conjunction with the capacitor 78 (FIG. 2), there is provided the aforementioned third winding 35 which is energized from the primary winding 24 of the transformer 18. This winding 35 connects to a rectifying bridge 222, and the output at 224 leads through line 226 (see FIG. 5), through the switch 54b (see FIG. 2), through the thermal switch 76 to maintain the charge on the capacitor 78.

The diodes 228 and 230 (FIG. 5) prevent high voltage from appearing in the drive circuitry in the event of failure of either of the transistors 48a or 48b.

Figure 5:
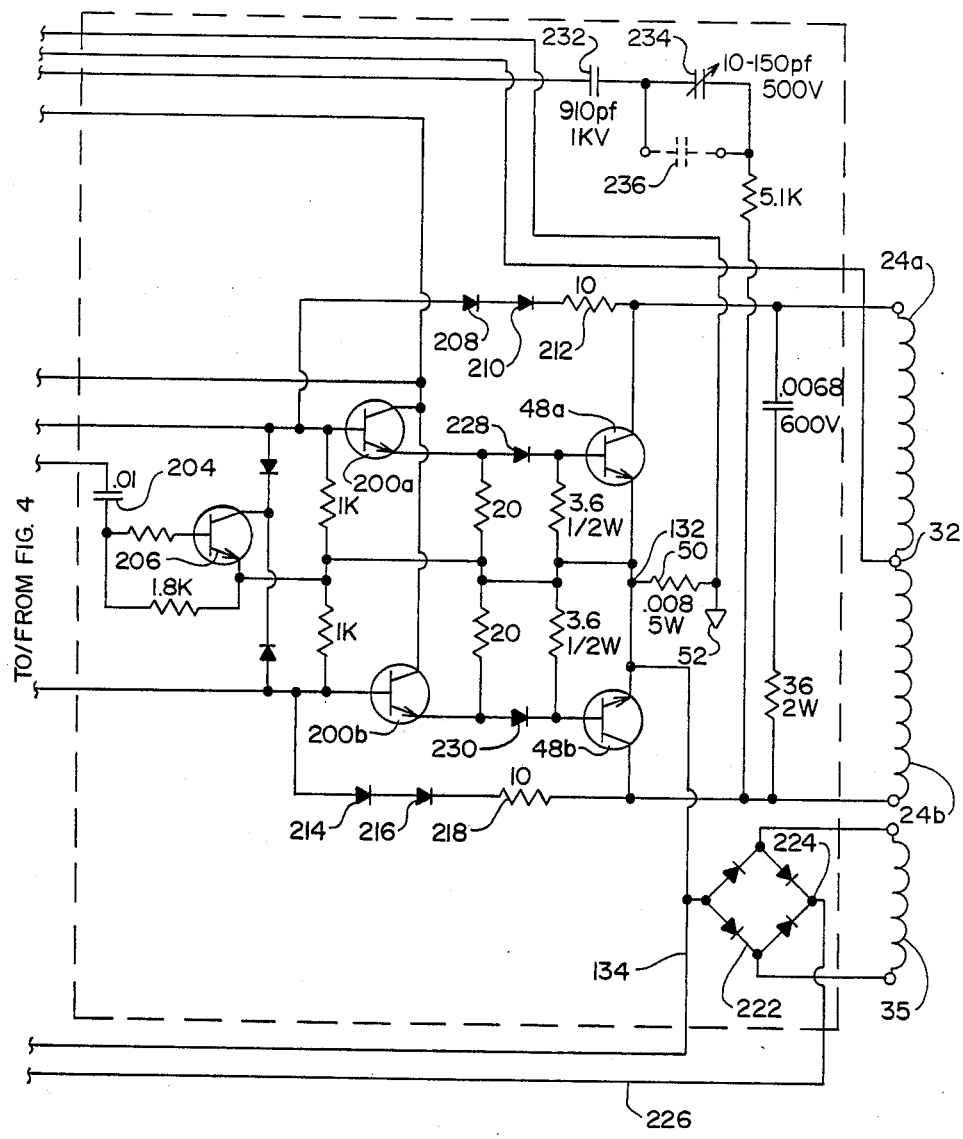

The capacitors 232, 234 and 236 are used to null out circulating ground currents which could possibly get into mixers or other low level support equipment in the complete system (see FIG. 5).

It should also be noted that the hysteresis built around the comparator 86b (FIG. 2) will shut down the entire power supply if the low voltage supply at capacitor 78 falls below 8 volts. This keeps the regulated 5 volt supply functioning and insures enough drive current to keep the main switching transistors 48a and 48b fully on under full load/low line conditions. Should the low voltage supply fall below this point, the power supply cycles back to the start sequence (i.e. operates through the start-up pulse width regulator 44).

The optical coupler 240 (FIG. 2) which incorporates the light-emitting diode 114 and the transistor 116 provides primary to secondary isolation for shut-down commands from the power amplifier. As with a low voltage shutdown, any shut-down signal from the amplifier will cause the power supply to go through its start sequence through the operation of the start-up pulse width regulator 44.

j. Summary Of The Operation Of The Control Circuitry

As a preliminary comment, it should be pointed out that in the optimized design of the present invention, the transformer 18 is made (relative to many prior art amplifiers of comparable power output) very small. In order for this transformer 18 to operate effectively, it is necessary that the current pulses passing through the primary of the transformer 18 be regulated so that during low power requirements of the apparatus 10, these pulses are of very short duration, while during periods of higher power requirements, the pulse width (i.e. duration) is greater. The reasons for this will be discussed in greater detail in the following section which discusses in more detail the design and operation of the transformer 18.

To proceed with the summary of the operation of the control circuitry 16, let it be assumed that the apparatus 10 is not connected to a power source, and that there is no charge on the two main power capacitors 20a and 20b and also no charge on the capacitors 72a, 72b, and 78 which are located in the power input component 34 (FIG. 2). When the plug 36 is inserted into a socket of a conventional power supply (e.g. 60 cycle, 115-125 volts), before the switch 54 (having two switch components 54a and 54b) is closed, there is a trickle of current through line 71 to charge the capacitors 72a and 72b at least to an intermediate level (e.g. 100 volts). Then when the switches 54a and 54b are closed simultaneously, line current flows through the switch 54a and through the bridge 73 to charge the main power capacitors 72a and 72b up to their full voltage level (e.g. about 160 to 170 volts). At the same time, current flows through the switch 54b to begin charging the capacitor 78 up to a lesser voltage level (e.g. about 24-26 volts).

With regard to the pulse width reference adjustment 42, the connecting point 162 is set on the resistor or rheostat 154 so that the desired reference voltage is transmitted to the IC 82 of the main pulse generator and control unit 40.

When the voltage on the capacitor 78 reaches a level of approximately 7 to 8 volts, this causes the oscillator 122 in the IC 82 (FIG. 4) to start operating, and this will in turn begin transmitting the regular ramp voltage signals through the pin 125. However, during this first portion of the start-up period, the output 112 of the comparator 86b remains high to block the signals transmitted from the pin 125.

The capacitor 78 continues to become charged to a higher level until it reaches approximately the 22 to 24 volt level, at which time it causes the output 112 of the comparator 26b to go low. This permits the ramp voltage pulses from the output pin 125 of the IC 82 to act on the comparator 86c (FIG. 3) to cause its output 146 to go low on each clocking signal. (As described previously, the output of the pin 125 of IC 82 is such that the voltage rises to a peak level and then drops abruptly to zero. At the instant when this abrupt voltage drop occurs, there is a strong negative pulse which is caused to travel from the capacitor 170 [FIG. 2] to the plus terminal of the comparator 86c. This causes the ouput 146 of the comparator 86c to go low, which in turn acts through the pin 144 [i.e. the shut-down pin] in a manner to turn off the transistor 142 of IC 82 [FIG. 4]).

The effect of the output 146 of the comparator 86c going low is to enable the IC 82 (FIG. 4) to operate so that the logic component 124 turns on the transistors 126a and 126b alternately at regularly spaced time intervals. The time period during which each transistor 126a and 126b is turned on (i.e. the pulse width) is controlled during the ongoing operation of the apparatus by the comparator 128 and the amplifier 130 in the manner described previously herein. During the start-up period, this pulse width is determined by the start-up pulse width regulator 44.

As described above, when the capacitor 78 reaches a predetermined voltage level, the output of the comparator 86b goes low to in turn cause the comparator 86c to go low, to send the enabling signal to the IC 82 so as to cause one or the other of the transistors 126a or 126b in the IC 82 to become conductive. Let it be assumed that the transistor 126a initially becomes conductive. This turns on the transistor 200a, which in turn causes the transistor 48a to be conductive.

As described previously, positive current flows from the midpoint 32 of the primary winding 24 through the upper primary winding portion 24a, through the then conducting transistor 48a, and thence through the voltage reference 50 to ground at 52. Since the main power capacitors 20a and 20b have no charge at this time, the winding 24a, the transistor 48a and the resistor 50a essentially see a short circuit. The current begins to rise very rapidly to cause the voltage drop across the resistor 50 to increase at a rapid rate, with a voltage increase appearing at point 132 to the left of the resistor 50.

When the voltage at point 132 to the left of the resistor 50 reaches a predetermined level, this voltage, being transmitted through the line 134, causes the comparator 86d to go high (FIG. 3) to in turn cause the output 146 of the comparator 86c to go high. This in turn causes the transistor 142 (FIG. 4) of the IC 82 to become conductive, so as to essentially short the output of the amplifier 130 to ground, this acting through the comparator 128 to cause the logic component 124 to cause the then conducting transistor 126a to become nonconductive. Thus, the pulse width at that time is determined by the start-up pulse width regulator 44, which in turn is responsive to the current flowing through the primary winding 24 and the related transistor 48a or 48b, that current being sensed by the regulating resistor 50.

After the start-up pulse width regulator 44 terminates the pulse signal output of IC 82, on the next clocked output from the pin 125 of the IC 82, the comparator 86c is again caused to go low, to send an enabling signal back to the IC 82. Also, the oscillator 122 has in the meantime acted on the logic circuit component 124 to place the transistor 126b into the operative condition. The enabling signal from the comparator 86c causes the other transistor 126b to become conductive, which in turn causes the main power transistor 48b to become conductive. This causes current to flow through the lower half 24b of the primary winding 24, through the transistor 48b and through the resistor 50 to ground at 52. Then the same cycle is repeated as described immediately above.

For several seconds of operation, the two capacitors 20a and 20b continue to be charged to a higher voltage level, as the start-up pulse width regulator 44 continues to operate. As this continues, the current pulses traveling through the control resistor 50 rise less abruptly, and eventually, the voltage rise at point 132 is sufficiently low so that it is not able to cause the comparator 86d and the comparator 86c to go high. At that time, the start-up pulse width regulator 44 becomes inoperative, and the timing and duration of the pulses during which the transistors 126a and 126b are conductive is determined by the IC 82 responding directly to the voltage rise across the regulating resistor 50. As described previously, the plus terminal of the amplifier 130 receives its input from the aforementioned control resistor 50, with the voltage at the point 132 to the left of the resistor 50 being directed through line 134 through two voltage dividing resistors 136a and 136b to the voltage reference source 88i. The juncture point 138 between the two resistors 136a and 136b is in turn connected to the capacitor 140 which serves to integrate the voltage spikes from the resistor 50.

After the start-up phase and with the capacitors 20a and 20b charged to their full voltage level, when the current flowing through the primary winding 24a is very low, the voltage rise across the control resistor 50 will also be quite low. The effect of this is that the amplifier 130 acts through the comparator 128 to in turn act through the logic component 124 to cause the transistors 126a and 126b to turn on for rather short intervals. However, as the current through the primary winding 24a becomes greater, the voltage rise across the resistor 50 becomes greater, so as to act on the amplifier 130 to cause the transistors 126a and 126b to be conductive during greater time periods (i.e. increasing the pulse width).

As indicated previously, the signals amplified by an audio amplifier (generally signals amplifying musical sounds) vary greatly in amplitude, with the low amplitude periods generally exceeding the high amplitude periods by a substantial amount. During the low amplitude periods, generally very little current is drawn from the main power capacitors 20a and 20b. With the capacitors 20a and 20b fully charged, and with very little current being required by the amplifier, the current flow through the secondary winding 26 will be very low. This in turn means that the current flowing through the primary winding 24 will likewise rise only to a very low level, so that the voltage rise across the regulating resistor 50 will also be very low. This in turn means that the control pulses from the transistors 126a and 126b will be of very small width.

However, let it be assumed that the charge on the capacitors 20a and 20b begins to drop. This would normally result from the apparatus amplifying sounds of greater amplitude, thus having higher power requirements. This would cause the current through the primary winding 24 to rise more rapidly and to a higher level, thus increasing the voltage rise across the regulating resistor 50, which in turn would react through the IC 82 to cause the pulse widths to be of greater duration.

Thus it can be appreciated that the wave form of the voltage applied across each half of the primary winding 24a or 24b is a square wave, which rises abruptly up to a predetermined voltage level and then drops abruptly to zero level. The current that flows through each half winding 24a or 24b rises through the duration of each pulse. Further, a "cycle" as used herein is intended to mean a period during which both transistors 48a and 48b are made alternatively conductive, so that two power pulses are provided during each cycle.

The capacitors 20a and 20b are adapted to be charged to substantially constant voltage levels within a predetermined voltage range. However, it is to be understood that "substantially constant" as applied to capacitors 20a and 20b and other components is meant to include certain variations. For example, there will be a certain variation of voltage simply due to the amplifier demanding greater power during certain time periods. Also, due to variations in the line voltage that supplies the apparatus will have an effect on the voltage level to which the capacitors 20a and 20b can be charged, and this will be explained below.

A significant feature of the control cicuitry 16 of the present invention is that the width of the pulses which cause the power transistors 48a and 48b to be conductive is properly controlled in spite of varying operating conditions, such as changes in the line voltage. Let it be assumed, for example, that the two capacitors 20a and 20b are to be charged to the plus 75 and minus 75 volt level, and that this would normally occur when the line voltage was at 120 volts, this resulting in a peak D.C. voltage of about 169 volts. Let it be assumed that the line voltage drops to, for example, 110 volts, so that there is a corresponding decrease in the peak D.C. voltage. Under these circumstances, it would not be possible for the transformer 18 to charge the capacitors 20a and 20b to their full plus 75 and minus 75 volt charge since the transformer 18 cannot generate that high of a voltage. If the control circuitry 16 were made directly responsive to the voltage on the capacitor(s) 20a and/or 20b in a manner that if the full voltage level were not reached, the pulses would be made of greater and greater duration, then we would have a situation where the pulses delivered by the transistors 126a and 126b would be at the full width, in spite of the fact that the amplifier may at that time have very low power requirements. As will be discussed more fully in the subsequent section dealing with the construction and operation of the transformer 18, this would cause the transformer 18 to overheat.

However, with the control circuitry of the present invention, this undesired situation is avoided. Let it be assumed that with the control circuitry of the present invention, the line voltage drops by, for example, 10 percent. Under these circumstances, it would not be possible to charge the capacitors 20a and 20b only to the plus and minus 75 volt levels, but only to a 67.5 volt level (plus and minus). Let it be further assumed that the audio signal being amplified is at a quite low amplitude, so that there are very low power requirements. The current flowing from the secondary winding 26 to the capacitors 20a and 20b would be quite low, so that the current through the primary winding 25 would also be quite low, this producing only a very small voltage increase across the control resistor 50. This in turn would result in pulse widths which are quite small. However, if the power requirements of the amplifier become greater, so that the voltage levels on the capacitors 20a and 20b diminish toward the zero level from the 67.5 volt levels (plus and minus, respectively), then the current flowing through the secondary winding 28 would be greater, thus causing a greater voltage rise across the control resistor 50, which in turn would broaden the pulse widths so that greater current would be supplied through the transformer 18.

Thus, it can be appreciated that the control circuitry 16 in effect responds to the actual power requirements of the amplifier, rather than responding simply to a predetermined desired fixed voltage level on the capacitors 20a and 20b. In another sense, it can be stated that the width or strength of the control pulses are made dependent upon the power demands of the amplifier and an amplitude value which is equal to the line voltage times a certain constant, minus the charge on one or more of the power capacitors 20a and 20b, with this constant being related to the turns ratio of the transformer 18.

On the other hand, during the start-up phase, the control circuitry 16 is made responsive primarily to the level of the current pulses passing through the primary winding 24.

k. Design And Operation Of The Transformer 18

It is believed that a clearer understanding of the advantages of the present invention will be obtained by first presenting some general considerations relating to transformer design, and particularly as these relate to audio amplifiers.

Figure 6:
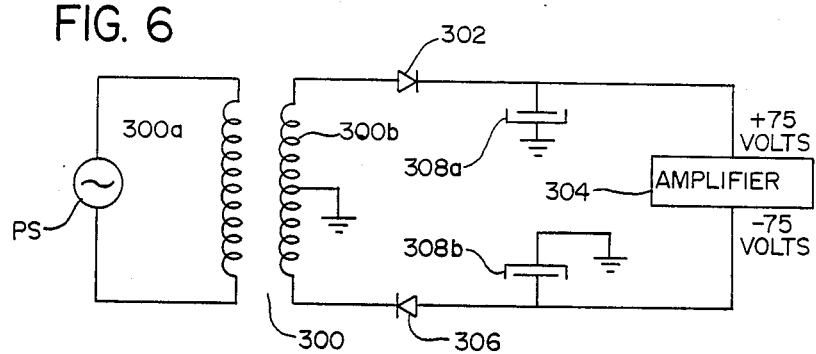
FIG. 6 is a schematic drawing of a conventional prior art power supply for an audio amplifier, where there is no duty cycle control.

FIG. 6 illustrates the basic configuration of a conventional amplifier power supply. Conventional 115-125 volt 60 cycle alternating current is applied from a power source PS to the primary winding 300a of a transformer 300. The secondary winding 300b of the transformer 300 has its upper end connected through a diode 302 to the upper terminal of the amplifier 304. The lower terminal of the secondary winding 300b is connected through a second diode 306 to the lower terminal of the amplifier 304. Upper and lower capacitors 308a and 308b, respectively, maintain the voltages imposed upon the amplifier 304 at substantially constant values. Normally, the supply voltage has a peak voltage input of approximately 169 volts. Let it be assumed that the transformer 300 is designed so that the input voltage imposed on the upper terminal of the amplifier 304 is designed to be plus 75 volts, and the voltage at the lower terminal is minus 75 volts. The center of the secondary winding 300b is normally tapped to ground.

Figure 7:
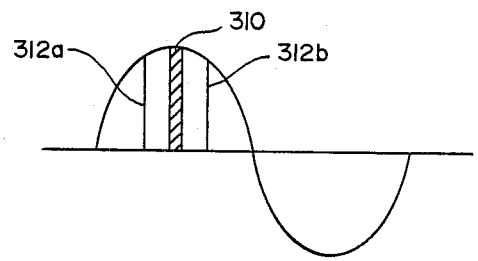
FIG. 7 illustrates the wave form passing through the primary winding of the apparatus of FIG. 6.

An indicated previously, an audio signal typically has peak power requirements of relatively short duration and average power requirements of longer duration which are possibly 1/20th of 1/10th of the peak power requirement. Thus, most of the time the amplifier is operating at only 1/10th to 1/20th of full power. To understand the implication of this fact, reference is made to FIG. 7, illustrating the sine wave of the incoming voltage supplied to a primary of a conventional audio amplifier transformer connected to receive conventional 115-125 volt alternating current. The turns ratio of the primary and secondary winding of the conventional transformer is such that with the primary conducting at least some current throughout the entire sine wave of the incoming voltage, the peak voltage generated in the secondary is just slightly larger than the plus 75 and minus 75 volt level required by such a conventional audio amplifier. When the amplifying component of the amplifier is demanding only average power, current flow in the secondary winding for only a very short period of time at the very peak of the sine wave of the input voltage. This time period is indicated at 310 in FIG. 7. When there are peak power requirements, there is an immediate drain on the conventional storage capacitors 308a and 308b of the power supply to lower their voltage levels slightly, and the result is that the secondary winding is conducting for a longer period of time so that the conducting portion of the sine wave of FIG. 7 is broadened out to, for example, lines indicated at 312a and 312b. It should be noted that since the two lines 312a and 312b are spaced further apart, the voltage produced in the secondary winding 300b during peak power requirements is moderately down from the peak voltage delivered during periods of low power requirements.

In designing a transformer suitable for use in a conventional amplifier power system as described above, careful consideration must be given to accommodating the idling current in the primary. Idling current is the current which flows in the primary when no current is flowing in the secondary. In a transformer having a small number of windings in the primary and thus a small inductance, the primary idling current may become large enough to cause the transformer to heat up to an undesired extent. This fact dictates the use of a primary coil having a large number of windings.

A suitable audio amplifier transformer of conventional design must also be capable of accommodating a relatively large current flow to the primary and secondary coils in order to handle peak power demands. Thus, the wire forming the coils must be of sufficient diameter to allow the transformer to deliver high current at peak loads, without too much internal resistance. The result is a very large, heavy transformer having a large number of windings to keep the inductance in the primary sufficiently high, and relatively thick wire to keep the resistance relatively low in spite of the rather long length of wire in the transformer.

Figure 8:
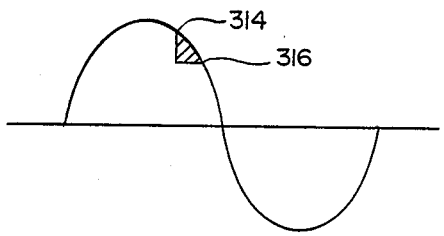
FIGS. 8 and 9 represent the wave forms passing through the primary winding of the transformer of the power supply described in U.S. Pat. No. 4,484,150, and also illustrating the effect of the duty cycle control circuitry of the same.

A significant improvement over the conventional power supply configuration shown in FIG. 6 was achieved in the amplifying apparatus described in the aforementioned U.S. Pat. No. 4,484,150. First, there was provided a somewhat higher primary to secondary turns ratio than in the power system shown in FIG. 6. Further, a switching device was incorporated between the power source PS and the primary winding 300a, and a duty cycle control was incorporated in the following manner. During periods of low power requirement, the control switch is turned on during a later part in the last half of each half cycle of the sine wave. This is illustrated in FIG. 8, and it can be seen that the switch is closed at point 314 on the sine wave. This point 314 is selected so that current will flow for a short period of time until the sine wave reaches point 316, at which time the voltage generated by the primary winding generates a voltage in the secondary which is equal to the charge then on the main power capacitors that supply the current to the amplifier. At point 316, current flow in the secondary winding would stop, and a relatively small amount of current would still be flowing through the primary winding, due to the inductance of the primary winding.

Figure 9:
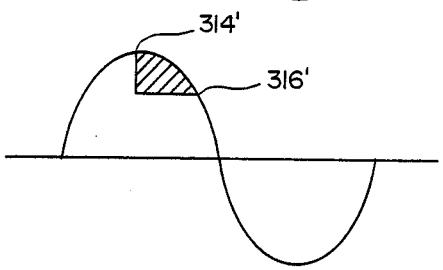

When greater power is required, the switching device is turned on at an earlier time in the last half of each half cycle so that a stronger current pulse of greater duration was caused to pass through the primary. These points are illustrated at 314' and 316' of FIG. 9.

It was found that with the system described in U.S. Pat. No. 4,484,150, it was possible to design the transforer so that it was only a fraction of the size and weight of the transformer used in the earlier systems, such as shown in FIG. 6. Yet it was capable of producing a power output comparable to that of conventional amplifiers using transformers of much larger size.

Figure 10:
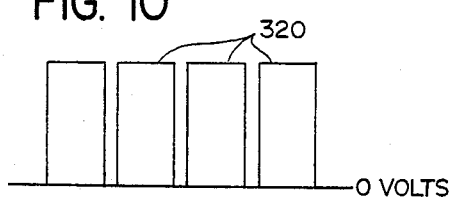
FIGS. 10 and 11 illustrate the wave forms passing through the primary winding of the present invention.
Figure 11:
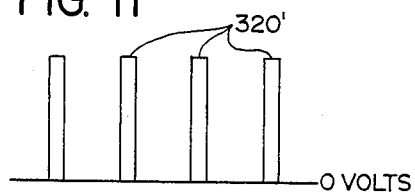

With respect to the present invention, as discussed previously herein, the voltage imposed across the two halves of the primary winding 24 is in the form of a square wave D.C. voltage. As illustrated in FIG. 10, the voltage is represented as a series of square wave pulses 320. These pulses 320 are shown to be of relativley wide width, and pulse waves of this greater width would be generated during peak power requirements of the amplifier. In FIG. 11, the pulse widths are designated 320', and these relatively narrow pulse widths would be generated during periods of low power requirements during the operation of the amplifier. Further, as discussed earlier herein with reference to the control circuitry, the voltage level of these pulses 320 and 320' would be dependent upon the line voltage which is supplying power to the apparatus. Even though the line voltage may drop or rise, the width of the pulses 320 or 320' would vary only in accordance with the actual power requirements, rather than vary with the precise voltage level on the storage capacitors 20a and 20b.

It has been found that in the present invention it is possible to make the transformer 18 yet smaller (in terms of size and weight) in comparison with the transformer size and weight achievable in U.S. Pat. No. 4,484,150 for a given power output. This will be explained further below.

To explain this further, let us now turn our attention to some of the considerations relating to tranformers in general, and particularly how these relate to the frequency at which the transformer operates. It has long been known that to provide a transformer of a given power output, the size and weight of the transformer can be reduced by increasing the frequency at which the transformer operates.

Since at higher operating frequencies the flux field builds up only to a low level, it is possible to make the core of a smaller size without the core saturating. This means that the number of windings in the primary and secondary can be reduced. Further, the total length of wire to make the primary and secondary windings can be reduced, so that for a given resistance in each of the primary and secondary windings, the cross-sectional area of the wire can be reduced.

This has led some to design prior art audio amplifiers which operate at very high frequencies (e.g. as high as 20,000 Hertz, and even up to 120,000 Hertz). There are some considerations which present disadvantages to such a high frequency power supply for audio amplifiers. One of these is that the core losses of the transformer increase with frequency in a manner that for a given core, the losses increase generally in proportion to the square of the frequency. These core losses can become particularly significant with a laminated silicon steel core (or some other core material having similar characteristics). To keep the core losses within reasonable limits, it is at present necessary to make the core of very high frequency switching transformers (e.g. 20,000 Hertz or more) with ferrite cores which generate relatively low core losses.

While ferrite transformer cores are well-suited to use in transformers that switch at a very high frequency, these become less desirable as the frequency decreases. The main reason for this is that the ferrite cores saturate at a relatively low flux density, as well as having a low Curie temperature. Thus, to avoid saturation at frequencies well below the 20,000 Hertz level, the core itself becomes unnecessarily large, thus making the transformer impractical to use.

In the preferred form of the invention, the core losses are kept to a reasonably low level not only by providing the power pulses for the transformer within a proper frequency range, but also by use of the power demand control circuitry described above. Hence, when power requirements are low, the duty cycle is correspondingly low (i.e. the pulses are of shorter duration) which results in a relatively low flux density, which in turn causes the core losses to be substantially reduced.

Another consideration is the switching losses. In general, to operate a transformer at a very high frequency, a conventional arrangement is to rectify a conventional 60-cycle A.C. current to produce a D.C. output. This D.C. output is then transformed into a series of pulses to energize the primary winding of the transformer. This in turn necessitates the switching of the direct current at a frequency related to the operating frequency of the transformer.

Even though the switching can with modern techniques be accomplished rather rapidly, there are still short increments of time during which the switching occurs. As the voltage changes from one voltage level to another during switching, much of the dissipation of the power occurs in the switching device itself (e.g. a transistor or some other switching device). Thus, as the frequency increases, and with the time increments during which switching occurs remaining constant, the losses due to switching tend to increase, this necessitating larger heat sinks to dissipate this energy and keep the transistors or other switching elements within proper temperature limits.

Another consideration is that in providing a switching power supply at very high frequencies in conjunction with an audio amplifier, there are certain additional complexities in the circuitry.

As indicated previously, the applicants have found that a highly desirable balance of operating characteristics can be achieved when the present invention in operating in a frequency range between approximately 400 Hertz to 2000 Hertz, with the preferred range being between 800 to 1500 Hertz. As indicated previously, in the preferred embodiment described herein, the frequency is at 1100 Hertz. This results in a power supply with a relatively small transformer that operates with relatively high efficiency.

It has been found in the present invention that it is possible to build an amplifier having a power output of 1000 watts, with a total weight of the transformer being two pounds four and one-half ounces. The core is made of a laminated silicon steel structure, in an "E-I" configuration, with the winding being positioned in the annular gap provided by the outer cylindrical portion of the core and the inner cylindrical portion. In such a transformer, the two halves of the primary winding each have eighty turns of number 18 copper wire. The secondary has upper and lower sets of windings, with each set being tapped at four stepped locations to four storage power capacitors. The one set of capacitors has stepped voltages of approximately plug 25 volts, plus 50 volts, plus 80 volts and plus 130 volts. The other set is stepped similarly, but with the voltage being minus values. The winding portion which charges the plus 25 volt capacitor has 12 turns of number 18 wire. The next portion which charges the 50 volt capacitor has eleven turns of number 18 wire. The next portion that charges the 80 volt capacitor has 14 turns of number 20 wire, and the final coil portion that charges the 130 volt capacitor has twenty-four turns of number 22 wire. These four secondary coil portions are connected in series. The same number of turns and size of wire is used in the other set in the secondary winding to charge the capacitors to minus voltages. The third coil that supplies the auxiliary power (i.e. corresponding to the coil 35 in the preferred embodiment) has seven turns of number 24 wire.

Such a transformer, incorporated in the present invention is uniquely suited for use in an audio amplifier in that it is capable of delivering high power for shorter periods of time and not experience overheating, and lower power for more extended periods of time. Even though the transformer is relatively small, in this particular operating environment of an audio amplifier, it can operate very effectively without overheating.

It is to be understood that various modifications could be made without departing from the basic teachings of the present invention.

What is claimed is:

1. An apparatus for amplifying an audio signal having an amplitude which varies at an audio frequency, said apparatus comprising:
    (a) audio amplifier means for amplifying the audio signal to produce an output corresponding to the audio signal, said amplifier means comprising an audio signal receiving means for receiving the audio signal and a power receiving means for receiving electrical energy for producing the output, said amplifier means comprising power capacitor means adapted to be charged to a substantially constant voltage level within a predetermined voltage range, (b) a power transformer having a primary winding and a secondary winding, said secondary winding being operatively connected to said power receiving means to charge said capacitor means to said substantially constant voltage level within said voltage range, (c) power supply and control means adapted to be connected to a source of electrical power that provides power at a voltage source level within a predetermined voltage range, and operatively connected to said primary winding to provide pulses of electrical energy of predetermined time periods of duration for said primary winding, with each pulse being of a substantially constant voltage level, said power supply and control means comprising:

(i) a D.C. power supply to supply power at a substantially constant voltage, (ii) switch means operatively connected between said D.C. power supply and said primary winding for operating in a conductive state to cause said pulses of electrical energy to be delivered to said primary winding, and having a nonconductive state, (iii) sensing means responsive to a value related to magnitude of current passing through said transformer to provide a control value related to the magnitude of power demands of the amplifier means, (iv) control means responsive to said sensing means to cause said switch means to be conductive and nonconductive alternately to cause said pulses of electrical energy from said D.C. power source to pass through said primary winding to energize said secondary winding, in a manner that pulses of lesser duration are provided during periods of lower power requirements of the amplifier means, and pulses of greater duration are provided during periods of greater power demands of the amplifier means, whereby under conditions where said voltage source level varies, said power supply and control means provides power pulses of adequate duration to supply the power demands of the amplifier means.

2. The apparatus as recited in claim 1, wherein said sending means is responsive to magnitude of current passing through said transformer.

3. The apparatus as recited in claim 1, wherein said sensing means is responsive to magnitude of current passing through the primary winding of the transformer.

4. The apparatus as recited in claim 3, wherein said power supply and control means comprises a pulse generator and control means which generates control pulses for said switch means of predetermined pulse width, and pulse width reference adjustment means to provide an adjustable reference level input for controlling duration of said signal pulses.

5. The apparatus as recited in claim 3, wherein said power supply and control means comprises pulse generator and control means to produce control pulses of predetermined pulse widths to cause said switch means to be conductive, and reference signal means to produce periodic ramp voltage reference signals, each of which has an increasing voltage level during a period of that signal, said pulse generator and control means comprising comparator means to compare said ramp voltage reference signals with the control value of the sensing means to control pulse widths of said control pulses.

6. The apparatus as recited in claim 2, wherein said power supply and control means comprises a pulse generator and control means which generates control pulses for said switch means of predetermined pulse width, and pulse width reference adjustment means to provide an adjustable reference level input for controlling duration of said signal pulses.

7. The apparatus as recited in claim 2, wherein said power supply and control means comprises pulse generator and control means to produce control pulses of predetermined pulse widths to cause said switch means to be conductive, and reference signal means to produce periodic ramp voltage reference signals, each of which has an increasing voltage level during a period of that signal, said pulse generator and control means comprising comparator means to compare said ramp voltage reference signals with the control value of the sensing means to control pulse widths of said control pulses.

8. The apparatus as recited in claim 7, wherein said power supply and control means further comprises a start-up pulse width regulator means, which is responsive to said ramp voltage reference signals to cause said pulse generator and control means to initiate the control pulses, said start-up pulse width regulator means being further responsive to said sensing means so as to control duration of said signal pulses in response to current in said transformer rising above a predetermined level.

9. The apparatus as recited in claim 8, wherein said pulse generator and control means has a disenable input adapted to receive a disenable signal to terminate production of control pulses, said disenable input being operatively connected to said start-up pulse width regulator means in a manner that said start-up pulse width regulator in response to current through said transformer rising above a predetermined level transmits a disenable signal to said pulse generator and control means.

10. The apparatus as recited in claim 1, wherein said control means comprises generator and control means which is responsive to said sensing means to produce control pulses of predetermined pulse width to cause said switch means to be conductive, and startup pulse width regulator means which is responsive to said sensing means to sense current through said power transformer above a predetermined level to terminate said control pulses by sending a terminating signal to said pulse generator and control means.

11. The apparatus as recited in claim 10, wherein said startup pulse width regulator means is arranged to be operative during a condition where current through said transformer rises to a relatively higher level to terminate said control pulses, and to be non-responsive to a lower level of current through said transformer so as not to terminate said control pulses in response to said sensing means.

12. An apparatus for amplifying an audio signal having an amplitude which varies at an audio frequency, said apparatus comprising:

(a) audio amplifier means for amplifying the audio signal to produce an output corresponding to the audio signal, said amplifier means comprising an audio signal receiving means for receiving the audio signal and a power receiving means for receiving electrical energy for producing the output, said amplifier means comprising power capacitor means adapted to be charged to a substantially constant voltage level within a predetermined voltage range, (b) a power transformer having a primary winding and a secondary winding, said secondary winding being operatively connected to said power receiving means to charge said capacitor means to said substantially constant voltage within said voltage range, (c) power input means adapted to be connected to a source of electrical power, which source provides power at a voltage source level within a predetermined voltage range, and to provide D.C. power at a substantially constant voltage, (d) switch means operatively connected between the power input means and the primary winding of the transformer, and having a conductive state to cause D.C. power from said power input means to pass through said primary winding, (e) sensing means responsive to a value related to magnitude of current passing through said transformer to produce a control value related to the magntidude of power demands of the amplifier means, (f) pulse generator and control means to produce switch control pulses of predetermined pulse widths to cause said switch means to be conductive, said pulse generator and control means being responsive to said sensing means in a manner that signal pulses of lesser duration are provided during periods of lower power requirements of the amplifier means, and signal pulses of greater duration are provided periods of greater power demands of the amplifier, to cause pulses of electrical energy of lesser and greater magnitude to pass through said transfer whereby under conditions where said voltage source level varies, said power supply and control means provides power pulses of adequate duration to supply the power demands of the amplifier means.

13. The apparatus as recited in claim 12, wherein said sensing means comprises impedance means connected in series with current passing through said transformer, and said control value is related to magnitude of voltage across said impedance means.

14. The apparatus as recited in claim 13, wherein said impedance means comprises resistor means connected in series with said transformer.

15. The apparatus as recited in claim 14, wherein said resistor means is connected in series with the primary winding of the transformer.

16. The apparatus as recited in claim 12, wherein said sensing means comprises impedance means connected in series with said primary winding, in a manner that current is delivered from said power input means, passes in series through said primary winding, through said switch means, and through said impedance means to ground, and said control value of the sensing means is related to a voltage drop across said impedance means.

17. The apparatus as recited in claim 16, wherein said impedance means comprises resistor means.

18. The apparatus as recited in claim 12, wherein said primary winding comprises first and second primary winding sections, and said switch means is arranged to cause current from said power input means to pass alternately through said first and second primary winding sections.

19. The apparatus as recited in claim 18, wherein said switch means comprises a first transistor means operatively connected to said first primary winding section and a second transistor means connected to the other of said primary winding sections, and said first and second transistor means are alternately made conductive, said power input means being connected to a common input to said two transformer primary winding sections, with each primary winding section being connected in series with its related transistor means and through said impedance means to ground.

20. The apparatus as recited in claim 19, wherein said impedance means comprises resistor means.

21. The apparatus as recited in claim 12, further comprising a turn on and shut down means, said power input means comprising power input capacitor means adapted to be charged to at least a minimum operating level for operation of at least part of said apparatus, said turn on and shut down means being responsive to said power input capacitor means to make said pulse generator and control means active and inactive in response to voltage on said power input capacitor means.

22. The apparatus as recited in claim 21, further comprising start up pulse width regulator means which is responsive to said turn on and shut down means to become operational, said start up pulse width regulator means further being responsive to said sensing means detecting current through said transformer above a predetermined level to terminate said control pulses to thus control pulse widths of said control pulses, said start up pulse width regulator means being arranged to become inoperative relative to terminating said control pulses when current through said transformer is below a predetermined level.

23. The apparatus as recited in claim 22, wherein said power supply and control means provides start signals to said pulse generator and control means to initiate said to intitate said control pulses.

24. The apparatus as recited in claim 22, further comprising a pulse width reference adjustment means to provide an adjustable reference level input to said pulse generator and control means for controlling duration of said control pulses.

25. The apparatus as recited in claim 12, wherein said pulse generator and control means comprises reference signal means to produce periodic ramp voltage reference signals, each of which has an increasing voltage level during a period of that reference signal, said pulse generator and control means comprising comparator means to compare said ramp voltage reference signals with the control value of the sensing means to control pulse widths of said control pulses, said apparatus further comprising start up pulse width regulator means which is responsive to said ramp voltage reference signals to cause said pulse generator and control means to initiate the control pulses, said start up pulse width regulator means being further responsive to said sensing means so as to control duration of said control pulses in response to current in said transformer rising above a predetermined level.

26. The apparatus as recited in claim 12, wherein:

(a) said sensing means comprises impedance means connected in series with current passing through said transformer, and said control value is related to magnitude of voltage across said impedance means, with said impedance means comprising resistor means connected in series with said transformer, (b) said apparatus further being characterized in that current is delivered from said power input means, passes in series through said primary winding, through said switch means, and through said impedance means to ground, and said control value of the sensing means is related to a voltage drop across said impedance means, (c) said primary winding comprising first and second primary winding sections, and said switch means as arranged to cause current from said power input means to pass alternately through said first and second primary winding sections.

27. The apparatus as recited in claim 26, wherein (a) said apparatus further comprises a turn on and shut down means, said power output means comprising power input capacitor means adapted to be charged to at least a minimum operating level for operation of at least part of said apparatus, said turn on and shut down means being responsive to said power input capacitor means to make said pulse generator and control means active and inactive in response to voltage on said power input capacitor means, (b) said pulse generator and control means further comprising reference signal means to produce periodic ramp voltage reference signals, each of which has an increasing voltage level during a period of that reference signal, said pulse generator and control means comprising comparator means to compare said ramp voltage reference signals with the control value of the sensing means to control pulse widths of said control pulses, (c) said apparatus further comprising startup pulse width generator means which is responsive to said ramp voltage reference signals to cause said pulse generator and control means to initiate the control pulses, said start up pulse width regulator means being further responsive to said sensing means so as to control duration of said control pulses in response to current in said transformer rising above a predetermined level, said start up pulse width regulator means being further responsive to said turn on and shut down means to become operational.

28. An apparatus for amplifying an audio signal having an amplitude which varies at an audio frequency, said apparatus comprising:

(a) audio amplifier means for amplifying the audio signal to produce an output corresponding to the audio signal, said amplifier means comprising an audio signal receiving means for receiving the audio signal and a power receiving means for receiving electrical energy for producing the output, said amplifier means comprising power capacitor means adapted to be charged to a substantially constant voltage level within a predetermined voltage range, (b) a power transformer having a primary winding and a secondary winding, said secondary winding being operatively connected to said power receiving means to charge said capacitor means to said substantially constant voltage within said voltage range, (c) power supply and control means adapted to be connected to a source of electrical power that provides power at a voltage source level within a predetermined voltage range, and operatively connected to said primary winding to provide pulses of electrical energy of predetermined time periods of duration for said primary, with each pulse being of a substantially constant voltage level, said power supply and control means comprising:

(i) a D.C. power supply to supply power at a substantially constant voltage, (ii) switch means operatively connected between said D.C. power supply and said primary winding for operating in a conductive state to cause said current pulses to be delivered to said primary and having a nonconductive state, (iii) control means to cause said switch means to turn on and off alternately to cause power pulses from the D.C. power source to pass through the primary winding to energize said secondary winding, said control means being responsive to a value which is equal to the line voltage times a constant, minus voltage on said capacitor means, where the constant is related to a turns ratio of said transformer means, in a manner that power of said current pulses varies in accordance with power consumed by said amplifier means whereby under conditions where said voltage source level varies, said power supply and control means provides power pulses of adequate duration to supply the power demands of the amplifier means.

29. The apparatus as recited in claim 28, wherein said control means is responsive to magnitude of current passing through said transformer.

30. The apparatus as recited in claim 29, wherein said control means is responsive to magnitude of current passing through the primary winding of the transformer.

31. The apparatus as recited in claim 30, wherein said power supply and control means comprises a pulse generator and control means which generates control pulses for said switch means of predetermined pulse width, and pulse width reference adjustment means to provide an adjustable reference level input for controlling duration of said signal pulses.

32. The apparatus as recited in claim 30, wherein said power supply and control means comprises pulse generator and control means to produce control pulses of predetermined pulse widths to cause said switch means to be conductive, and reference signal means to produce periodic ramp voltage reference signals, each of which has an increasing voltage level during a period of that signal, said pulse generator and control means comprising comparator means to compare said ramp voltage reference signals with the value of the control means to control pulse widths of said control pulses.

33. The apparatus as recited in claim 29, wherein said power supply and control means comprises a pulse generator and control means which generates control pulses for said switch means of predetermined pulse width, and pulse width reference adjustment means to provide an adjustable reference level input for controlling duration of said signal pulses.

34. The apparatus as recited in claim 29, wherein control means comprises pulse generator and control means to produce control pulses of predetermined pulse widths to cause said switch means to be conductive, and reference signal means to produce periodic ramp voltage reference signals, each of which has an increasing voltage level during a period of that signal, said pulse generator and control means comprising comparator means to compare said ramp voltage reference signals with the value of the control means to control pulse widths of said control pulses.

35. The apparatus as recited in claim 34, wherein said power supply and control means further comprises a start-up pulse width regulator means, which is responsive to said ramp voltage reference signals to cause said pulse generator and control means to initiate the control pulses, said start-up pulse width regulator means being further responsive to said control means so as to control duration of said control pulses in response to current in said transformer rising above a predetermined level.

36. The apparatus as recited in claim 35, wherein said pulse generator and control means has a disenable input adapted to receive a disenable signal to terminate production of control pulses, said disenable input being operatively connected to said start up pulse width regulator means in a manner that said start-up pulse width regulator in response to current through said transformer rising above a predetermined level transmits a disenable signal to said pulse generator and control means.

37. The apparatus as recited in claim 28, wherein said control means is further characterized in that each pair of pulses provided for said transformer comprises a cycle, and said control means operates to turn said switch means on and off to provide said pulses to be provided for the transformer at a frequency between 400 to 2000 cycles per second.

38. The apparatus as recited in claim 37, wherein said frequency is between 800 to 1500 cycles per second.

39. The apparatus as recited in claim 38, wherein said frequency is at about 1,100 cycles per second.

40. An apparatus for amplifying an audio signal having an amplitude which varies at an audio frequency, said apparatus comprising:
(a) audio amplifier means for amplifying the audio signal to produce an output corresponding to the audio signal, said amplifier means comprising an audio signal receiving means for receiving the audio signal and a power receiving means for receiving electrical energy for producing the output, said amplifier means comprising power capacitor means adapted to be charged to a substantially constant voltage level within a predetermined voltage range,
(b) a power transformer having a primary winding and a secondary winding, said secondary winding being operatively connected to said power receiving means to charge said capacitor means to said substantially constant voltage within said voltage range,
(c) power supply and control means adapted to be connected to a source of electrical power that provides power at a voltage source level within a predetermined voltage range, and operatively connected to said primary to provide power pulses of electrical energy of predetermined time periods of duration for said primary, with each pulse being of a substantially constant voltage level, said power supply and control means comprising:
(i) a D.C. power supply to supply power at a substantially constant voltage,
(ii) switch means operatively connected between said D.C. power supply and said primary winding for operating in a conductive state to cause said power pulses to be delivered to said primary and having a nonconductive state,
(iii) control means to cause said switch means to turn on and off alternately to cause said power pulses from said D.C. power source to pass through said primary winding to energize said secondary winding, said control means being characterized in that during periods of lower power requirements of said amplifier means, said power pulses are of lesser duration, which during periods of higher power requirements of said amplifier means, power pulses of greater duration are provided for said transformer,
(iv) said control means being further characterized in that each pair of pulses provided for said transformer comprises a cycle, and said control means operates to turn said switch means on and off to cause the power pulses to be provided for the transformer at a frequency between 400 to 2,000 cycles per second.

41. The apparatus as recited in claim 40, wherein said frequency is between 800 to 1,500 cycles per second.

42. The apparatus as recited in claim 41, wherein said frequency is at about 1,100 cycles per second.

43. The apparatus as recited in claim 40, wherein said primary winding comprises two primary winding sections, and said switch means arranged to cause current from said D.C. power supply to pass alternately through said two primary winding sections.

44. The apparatus as recited in claim 43, wherein said switch means comprises a first transistor means connected to one of said primary winding sections and a second transistor means connected to the other of said primary winding sections, and said first and second transistor means are alternately made conductive, said D.C. power supply being connected to a common input to said two transformer primary winding sections, with each primary winding section being connected in series with its related transistor means and through an impedance means to ground, with said impedance means having a voltage there across which provides a control value for said control means to control duration of said power pulses.

45. The apparatus as recited in claim 44, wherein said impedance means comprises resistor means.

46. A method of amplifying an audio signal having an amplitude which varies at an audio frequency, said method comprising:
(a) providing audio amplifier means for amplifying the audio signal to produce an output orresponding to the audio signal, said amplifier means comprising an audio signal receiving means for receiving the audio signal and a power receiving means for receiving electrical energy for producing the output, said amplifier means comprising power capacitor means adapted to be charged to a substantially constant voltage level within a predetermined voltage range,
(b) providing a power transformer having a primary winding and a secondary winding, said secondary winding being operatively connected to said power receiving means to charge said capacitor means to said substantially constant voltage level within said voltage range,
(c) providing power supply and control means and connecting said power supply and control means to a source of electrical power that provides power at a voltage source level within a predetermined voltage range, and operatively connecting said power supply and control means to said primary winding, (d) providing through said power supply and control means pulses of electrical energy of predetermined time periods of duration for said primary winding, with each pulse being of a substantially constant voltage level, said method further comprising:
  (i) providing a D.C. power supply to supply power at a substantially constant voltage,
  (ii) operating switch means which is connected between said D.C. power supply and said primary winding and operating said switch means to be conductive and non-conductive to cause said pulses of electrical energy to be delivered to said primary winding,
  (iii) sensing magnitude of power demands of said amplifier means and providing a control value related to the magnitude of power demands of the amplifier means,
  (iv) operating said switch means in response to the magnitude of said power demands to cause said switch means to be conductive and nonconductive alternately to cause said pulses of electrical energy from said D.C. power source to pass through said primary winding to energize said secondary winding, in a manner that pulses of lesser duration are provided during periods of lower power requirements of the amplifier means, and pulses of greater duration are provided during periods of greater power demands of the amplifier means, whereby under conditions where said voltage source level varies, said power supply and control means provides power pulses of adequate duration to supply the power demands of the amplifier means.

47. A method of amplifying an audio signal having an amplitude which varies at an audio frequency, said method comprising:
  (a) providing audio amplifier means for amplifying the audio signal to produce an output corresponding to the audio signal, said amplifier means comprising an audio signal receiving means for receiving the audio signal and a power receiving means for receiving electrical energy for producing the output, said amplifier means comprising power capacitor means adapted to be charged to a substantially constant voltage level within a predetermined voltage range,
  (b) providing a power transformer having a primary winding and a secondary winding, said secondary winding being operatively connected to said power receiving means to charge said capacitor means to said substantially constant voltage within said voltage range,
  (c) providing power supply and control means and connecting said power supply and control means to a source of electrical power that provides power at a voltage source level within a predetermined voltage range, and operatively connecting said power supply and control means to said primary winding,
  (d) providing through said power supply and control means pulses of electrical energy of predetermined time periods of duration for said primary winding, with each pulse being of a substantially constant voltage level, said method further comprising:
    (i) providing a D.C. power supply to supply power at a substantially constant voltage;
    (ii) operating switch means which is connected between said D.C. power supply and said primary winding and operating said switch means to be conductive and non-conductive to cause said pulses of electrical energy to be delivered to said primary winding,
    (iii) causing said switch means to be turned on and off alternately to cause power pulses from the D.C. power source to pass through the primary winding to energize said secondary winding, in response to a value which is equal to the line voltage times a constant, minus voltage on said capacitor means, where the constant is related to a turns ratio of said transformer means, so that under conditions where said voltage source level varies, said power supply and control means provides power pulses of adequate duration to supply the power demands of the amplifier means.

48. A method for amplifying an audio signal having an amplitude which varies at an audio frequency, said method comprising:
  (a) audio amplifier means for amplifying the audio signal to produce an output corresponding to the audio signal, said amplifier means comprising an audio signal receiving means for receiving the audio signal and a power receiving means for receiving electrical energy for producing the output, said amplifier means comprising power capacitor means adapted to be charged to a substantially constant voltage level within a predetermined voltage range,
  (b) providing a power transformer having a primary winding and a secondary winding, said secondary winding being operatively connected to said power receiving means to charge said capacitor means to said substantially constant voltage within said voltage range,
  (c) providing power supply and control means and connecting said power supply and control means to a source of electrical power that provides power at a voltage source level within a predetermined voltage range, and operatively connecting said power supply and control means to said primary winding,
  (d) providing through said power supply and control means pulses of electrical energy of predetermined time periods of duration for said primary winding, with each pulse being of a substantially constant voltage level, said method further comprising:
    (i) providing a D.C. power supply to supply power at a substantially constant voltage,
    (ii) operating switch means which is connected between said D.C. power supply and said primary winding and operating said switch means to be conductive and non-conductive to cause said pulses of electrical energy to be delivered to said primary winding,
    (iii) causing said switch means to turn on and off alternately to cause said power pulses from said D.C. power source to pass through said primary winding to energize said secondary winding, in that during periods of lower power requirements of said amplifier means, said power pulses are of lesser duration, while during periods of higher power requirements of said amplifier means, power pulses of greater duration are provided for said transformer, (iv) said method being further characterized in that each pair of pulses provided for said transformer comprises a cycle, and said method further comprising turning said switch means on and off to cause the power pulses to be provided for the transformer at a frequency between 400 to 2,000 cycles per second.

49. The method as recited in claim 48, wherein said frequency is between 800 to 1,500 cycles per second.

50. The method as recited in claim 49, wherein said frequency is at about 1,100 cycles per second.

51. The method as recited in claim 48, wherein said primary winding comprises two primary winding sections, and said switch means is operated to cause current from said D.C. power supply to pass alternately through said two primary winding sections.

* * * * *